(12) United States Patent
Shuai et al.

(10) Patent No.: US 11,495,693 B2
(45) Date of Patent: Nov. 8, 2022

(54) SEMICONDUCTOR MEMORY DEVICE AND FABRICATION METHOD THEREOF

(71) Applicant: UNITED MICROELECTRONICS CORP., Hsin-Chu (TW)

(72) Inventors: Hung-Hsun Shuai, Tainan (TW); Chih-Jung Chen, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 44 days.

(21) Appl. No.: 17/159,168

(22) Filed: Jan. 27, 2021

(65) Prior Publication Data

US 2022/0209017 A1 Jun. 30, 2022

(30) Foreign Application Priority Data

Dec. 31, 2020 (CN) .......................... 202011620388.7

(51) Int. Cl.
*H01L 29/788* (2006.01)
*H01L 21/265* (2006.01)
*H01L 21/762* (2006.01)
*H01L 29/06* (2006.01)
*H01L 29/08* (2006.01)
(Continued)

(52) U.S. Cl.
CPC .... *H01L 29/7881* (2013.01); *H01L 21/26513* (2013.01); *H01L 21/76224* (2013.01); *H01L 29/0653* (2013.01); *H01L 29/0847* (2013.01); *H01L 29/40114* (2019.08); *H01L 29/42328* (2013.01); *H01L 29/66825* (2013.01)

(58) Field of Classification Search
CPC .... H01L 27/11517–1156; H01L 29/788–7889; H01L 29/42324–42336; H01L 21/76224–76237; H01L 21/823481; H01L 21/823878; H01L 29/0649–0653; H01L 29/0843–0891; H01L 29/6636–66643; H01L 21/823418–823425; H01L 21/823814; H01L 21/823412; H01L 21/823807; H01L 29/66492; H01L 29/1041–1045; H01L 29/66537; H01L 29/66575–66598; H01L 29/66659; H01L 29/66636; G11C 16/0408–0458; G11C 11/5621–5642; G11C 2216/06–10
See application file for complete search history.

(56) References Cited

U.S. PATENT DOCUMENTS

2020/0152784 A1\* 5/2020 Chern ............... H01L 21/02697
2020/0161319 A1\* 5/2020 Wu .................. H01L 27/11541

\* cited by examiner

*Primary Examiner* — Sonya McCall-Shepard
(74) *Attorney, Agent, or Firm* — Winston Hsu

(57) ABSTRACT

A semiconductor memory device includes a substrate having a first active area and a second active area in proximity to the first active area. A trench isolation region is between the first active area and the second active area. A source line region is disposed in the first active area and adjacent to the trench isolation region. An erase gate is disposed on the source line region. A floating gate is disposed on a first side of the erase gate. A first control gate is disposed on the floating gate. A first word line is disposed adjacent to the floating gate and the first control gate and insulated therefrom. A second control gate is disposed on a second side of the erase gate and directly on the trench isolation region. A second word line is disposed adjacent to the second control gate and insulated therefrom.

19 Claims, 8 Drawing Sheets

(51) Int. Cl.
*H01L 21/28* (2006.01)
*H01L 29/423* (2006.01)
*H01L 29/66* (2006.01)

# SEMICONDUCTOR MEMORY DEVICE AND FABRICATION METHOD THEREOF

BACKGROUND OF THE INVENTION

1. Field of the Invention

The invention relates to the field of semiconductor technology, in particular to a flash memory device and a fabrication method thereof.

2. Description of the Prior Art

A flash memory is a type of memory that can be erased and reprogrammed in blocks instead of one byte at a time. A typical flash memory comprises a memory array, which includes a large number of memory cells. Each of the memory cells includes a floating gate field-effect transistor capable of holding charge. The cells are usually grouped into blocks. Each of the cells within a block can be electrically programmed in a random basis by charging the floating gate. The data in a cell is determined by the presence or absence of the charge in the floating gate. The charge can be removed from the floating gate by a block erase operation.

One issue with conventional flash memory devices is source line bias error, which is particularly acute for memory architectures where a large number memory cells have their sources tied together in a source line to ground. Parallel sensing of these memory cells can result in a substantial current through the source line. Due to a finite resistance of the source line, an appreciable voltage drop can occur which affects the accuracy of a sensing operation.

SUMMARY OF THE INVENTION

It is one object of the present invention to provide an improved semiconductor memory device and a manufacturing method thereof to solve the above-mentioned shortcomings or deficiencies of the prior art.

One aspect of the invention discloses a semiconductor memory device including a substrate comprising a first active area and a second active area in proximity to the first active area; a trench isolation region between the first active area and the second active area; a source line region disposed in the first active area and adjacent to the trench isolation region; an erase gate disposed on the source line region; a floating gate disposed on a first side of the erase gate; a first control gate disposed on the floating gate; a first word line disposed adjacent to the floating gate and the first control gate and insulated therefrom; a second control gate disposed on a second side of the erase gate and on the trench isolation region; and a second word line disposed adjacent to the second control gate and insulated therefrom.

According to some embodiments, the semiconductor memory device further comprises a first drain doped region disposed in the first active area and adjacent to the first word line.

According to some embodiments, the semiconductor memory device further comprises a second drain doped region disposed in the second active area and adjacent to the second word line.

According to some embodiments, the semiconductor memory device further comprises a heavily doped region disposed in the first active area and directly under the first word line.

According to some embodiments, the heavily doped region is contiguous with the first drain doped region and is spaced apart from the source line region.

According to some embodiments, the heavily doped region, the first drain doped region and the source line region are $N^+$ doped regions.

According to some embodiments, the semiconductor memory device further comprises an erase gate contact disposed directly on the erase gate.

According to some embodiments, the first active area and the second active area elongate along a first direction, and the source line region, the erase gate, the first word line, and the second word line elongate along a second direction.

According to some embodiments, the first direction is orthogonal to the second direction.

According to some embodiments, the erase gate is a T-shaped erase gate, and wherein a top corner of the floating gate points toward an inside corner of the T-shaped erase gate.

Another aspect of the invention provides a method of forming a semiconductor memory device. A substrate comprising a first active area and a second active area in proximity to the first active area is provided. A trench isolation region is formed between the first active area and the second active area. A floating gate is formed on the first active area. A first control gate is formed on the floating gate and a second control gate is formed on the trench isolation region. A first ion implantation process is performed to form a source line region in the first active area and adjacent to the trench isolation region, and form a heavily doped region in the first active area and spaced apart from the source line region. An erase gate is formed on the source line region. A first word line is formed adjacent to the floating gate and the first control gate. A second word line is formed adjacent to the second control gate.

According to some embodiments, after forming the second word line adjacent to the second control gate, a second ion implantation process is performed to form a first drain doped region in the first active area and adjacent to the first word line, and form a second drain doped region in the second active area and adjacent to the second word line.

According to some embodiments, the heavily doped region is contiguous with the first drain doped region.

According to some embodiments, the heavily doped region, the first drain doped region and the source line region are $N^+$ doped regions.

According to some embodiments, the method further comprises: forming an erase gate contact directly on the erase gate.

According to some embodiments, the first active area and the second active area elongate along a first direction, and the source line region, the erase gate, the first word line, and the second word line elongate along a second direction.

According to some embodiments, the first direction is orthogonal to the second direction.

According to some embodiments, the erase gate is a T-shaped erase gate, and wherein a top corner of the floating gate points toward an inside corner of the T-shaped erase gate.

According to some embodiments, the method according further comprises: forming an oxide-nitride-oxide (ONO) dielectric layer between the floating gate and the first control gate.

According to some embodiments, after forming the first control gate on the floating gate and the second control gate on the trench isolation region, a first spacer is formed on a` sidewall of the first control gate and a second spacer is formed on a sidewall of the second control gate.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
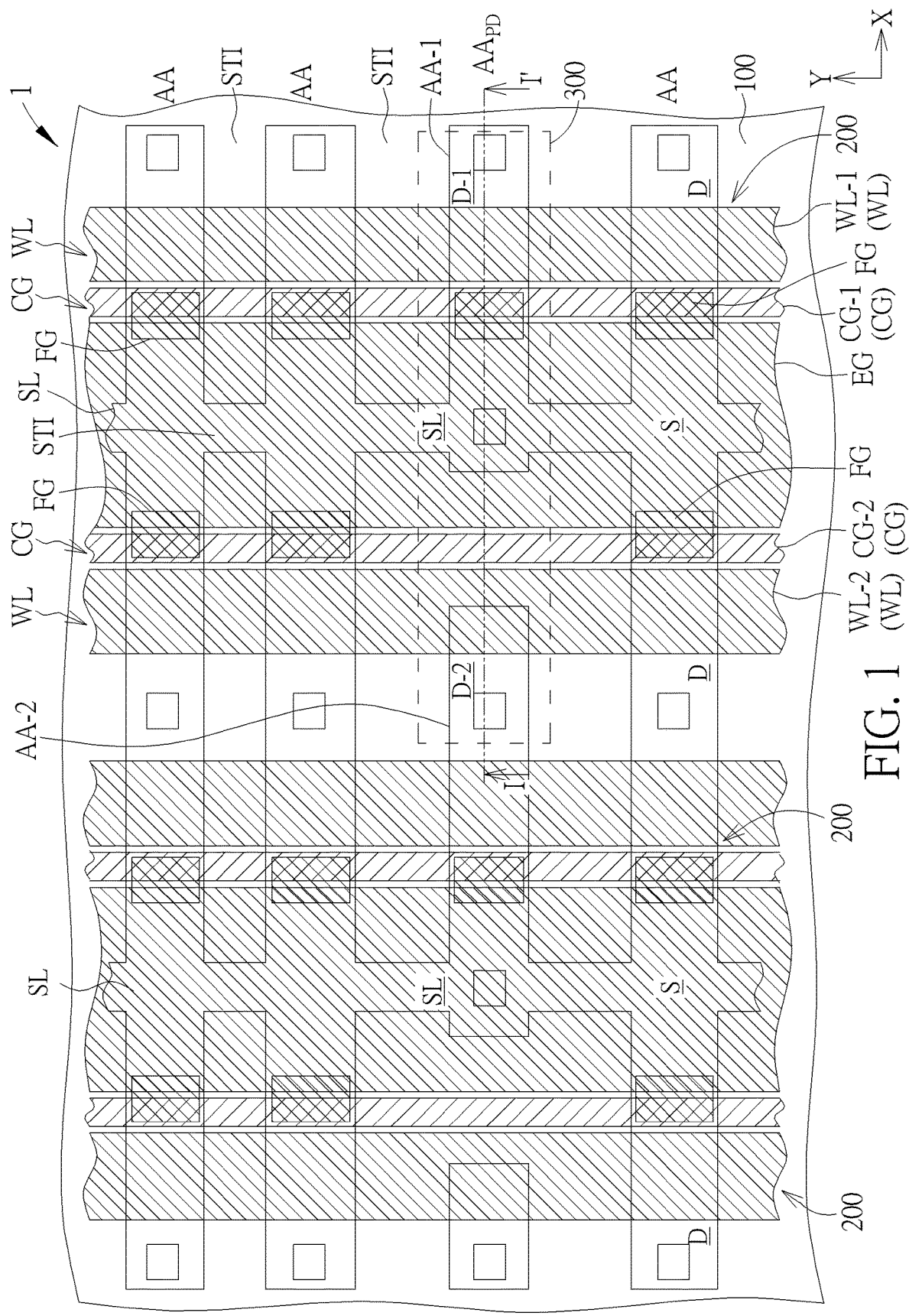
FIG. 1 is a partial layout diagram of a semiconductor memory device according to an embodiment of the invention.
Figure 2:
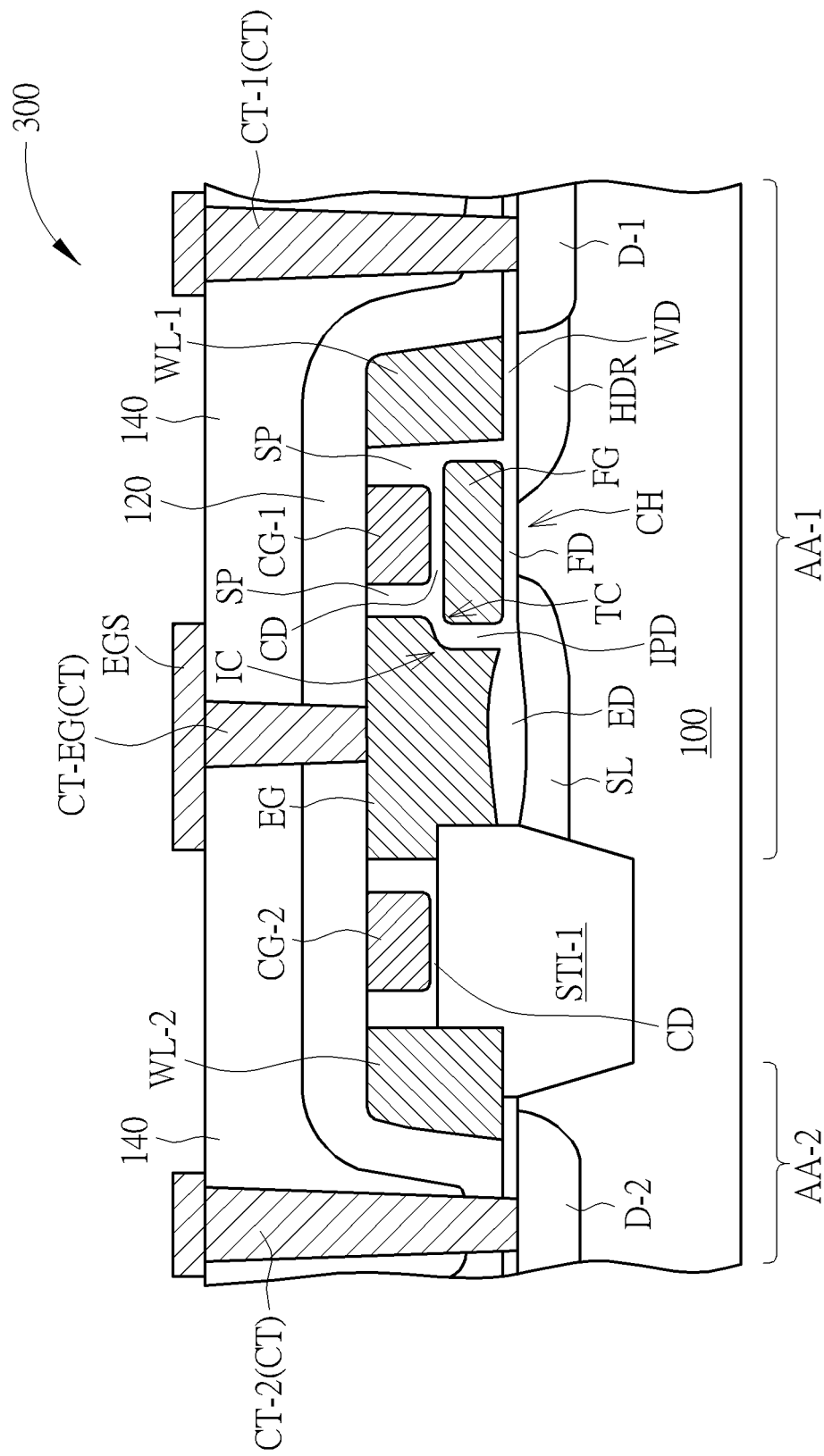
FIG. 2 is a schematic cross-sectional view taken along the line I-I' in FIG. 1.

Please refer to FIG. 1 and FIG. 2. FIG. 1 is a partial layout diagram of a semiconductor memory device 1 according to an embodiment of the present invention. FIG. 2 is a schematic cross-sectional view taken along the line I-I' in FIG. 1. As shown in FIG. 1, a plurality of active areas AA extending along a first direction such as a reference X-axis direction, and an active area $AA_{PD}$ between the active areas AA are provided on a substrate 100, for example, a P-type doped silicon substrate. The active area $AA_{PD}$ also extends along the reference X-axis direction. A source line region SL extending along a second direction or the reference Y-axis direction crosses the active areas AA and the active area $AA_{PD}$. According to an embodiment of the present invention, the first direction is orthogonal to the second direction. Between the active areas AA and the active area $AA_{PD}$, a trench isolation region STI is provided. According to an embodiment of the present invention, the active area $AA_{PD}$ is discontinuous in the reference X-axis direction.

According to an embodiment of the present invention, memory units 200 such as embedded super flash 3rd generation (ESF3) cells, are respectively arranged on the active areas AA. According to an embodiment of the present invention, for example, the memory cell 200 may include an erase gate EG directly above a source region S, for example, an $N^+$ source doped region, a control gate CG adjacent to the erase gate EG, a floating gate FG directly below the control gate CG, a word line WL adjacent to the control gate CG and the floating gate FG, and a drain region D, for example, an $N^+$ drain doped region, adjacent to the word line WL. The erase gate EG, the control gate CG, and the word line WL extend along the reference Y-axis direction. According to an embodiment of the present invention, the source region S of the memory cell 200 is electrically connected to the source line region SL. Generally, the memory cell 200 has a mirror-symmetrical structure with respect to the source line region SL. Since the ESF3 cell structure is well known in the art, thus the details are omitted here for simplicity and brevity.

As mentioned above, one issue with conventional flash memory devices is source line bias error, which is particularly acute for memory architectures where a large number memory cells have their sources tied together in a source line to ground. Parallel sensing of these memory cells can result in a substantial current through the source line. Due to a finite resistance of the source line, an appreciable voltage drop can occur which affects the accuracy of a sensing operation. The semiconductor memory device 1 according to the present invention addresses this issue.

As shown in FIG. 1 and FIG. 2, the semiconductor memory device 1 comprises a source line pull down (SLPD) device 300 provided on the active area $AA_{PD}$. According to an embodiment of the present invention, the active area $AA_{PD}$ extending along the first direction or the reference X-axis direction includes a first active area AA1, a second active area AA-2 adjacent to the first active area AA-1, and a trench isolation region STI-1 that isolates the first active area AA-1 from the second active area AA-2. The source line region SL is arranged in the first active area AA-1 and adjacent to the trench isolation region STI-1. The erase gate EG is arranged on the source line region SL. The floating gate FG is arranged on the first side of the erase gate EG. The first control gate CG-1 is arranged on the floating gate FG. The first word line WL-1 is disposed adjacent to and insulated from the floating gate FG and the first control gate CG-1. The second control gate CG-2 is arranged on the second side of the erase gate EG and located on the trench isolation region STI-1. The second word line WL-2 is disposed adjacent to and insulated from the second control gate CG-2. The first active area AA-1 and the second active area AA-2 extend along the first direction. The source line region SL, the erase gate EG, the first word line WL-1 and the second word line WL-2 extend along the second direction. According to an embodiment of the present invention, the first direction is orthogonal to the second direction.

According to an embodiment of the present invention, the semiconductor memory device 1 further includes a first drain doped region D-1 disposed in the first active area AA-1 and adjacent to the first word line WL-1, and a second drain doped region D-2 disposed in the second active area AA-2 and adjacent to the second word line WL-2. According to an embodiment of the present invention, the semiconductor memory device 1 further includes a heavily doped region HDR, which is disposed in the first active area AA-1 and directly under the first word line WL-1. According to an embodiment of the present invention, the heavily doped region HDR overlaps and is contiguous with the first drain doped region D-1, and is spaced apart from the source line region SL. According to an embodiment of the present invention, for example, the heavily doped region HDR, the first drain doped region D-1, and the source line region SL may be $N^+$ doped regions. According to an embodiment of the present invention, a channel region CH is disposed between the heavily doped region HDR and the source line region SL. The channel region CH is located directly under the floating gate FG. The heavily doped region HDR disposed directly under the first word line WL-1 can improve the source line pull-down efficiency.

As shown in FIG. 2, according to an embodiment of the present invention, the erase gate EG may be a T-shaped erase gate, characterized in that a top corner TC of the floating gate FG points toward an inside corner IC of the T-shaped erase gate EG to improve erase efficiency. According to an embodiment of the present invention, for example, a dielectric layer CD, for example, an oxide-nitride-oxide (ONO) dielectric layer, may be provided between the first control gate CG-1 and the floating gate FG and between the second control gate CG-2 and the trench isolation region STI-1. According to an embodiment of the present invention, for example, a floating gate dielectric layer FD may be provided between the floating gate FG and the substrate 100. According to an embodiment of the present invention, for example, an erase gate dielectric layer ED may be provided between the erase gate EG and the substrate 100. According to an embodiment of the present invention, for example, the thickness of the erase gate dielectric layer ED may be greater than that of the floating gate dielectric layer FD, but is not limited thereto. According to an embodiment of the present invention, for example, a dielectric layer IPD may be provided between the erase gate EG and the floating gate FG. A spacer SP may be provided on the sidewall of the first control gate CG-1, so that the first control gate CG-1 can be electrically isolated from the adjacent erase gate EG or the first word line WL-1.

According to an embodiment of the present invention, a contact etch stop layer 120 may be conformally deposited on the substrate 100, and an interlayer dielectric layer 140 may be provided on the contact etch stop layer 120. According to an embodiment of the present invention, a plurality of metal contacts CT may be provided in the interlayer dielectric layer 140 and the contact etch stop layer 120. For example, the metal contacts CT may include a first drain contact CT-1 electrically connected to the first drain doped region D-1, a second drain contact CT-2 electrically connected to the second drain doped region D-2, and an erase gate contact CT-EG electrically connected to the erase gate EG. According to an embodiment of the present invention, the erase gate contact CT-EG can be electrically connected to the erase gate connection strap EGS, and then electrically connected to an erase gate voltage through an upper-layer metal interconnection (not shown).

According to the present invention, the size of the memory array can be reduced by disposing the SLPD device 300 directly under the erase gate connection strap EGS. Of course, those skilled in the art should understand that the SLPD device 300 of the present invention does not necessarily need to be disposed directly under the erase gate connection strap EGS.

Figure 3:
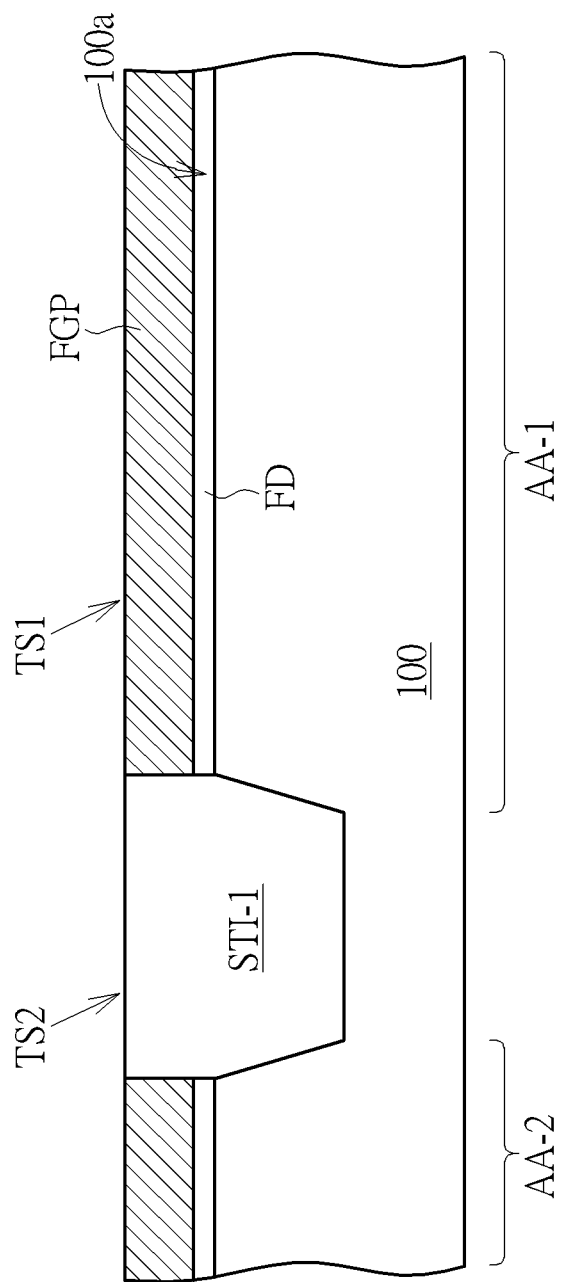
FIG. 3 to FIG. 8 are schematic diagrams illustrating a method of manufacturing a semiconductor memory device according to an embodiment of the present invention.

Please refer to FIG. 3 to FIG. 8, which are schematic diagrams of a method of fabricating a semiconductor memory device according to an embodiment of the present invention, wherein like regions, layers, materials and elements are designated by like numeral numbers or labels. As shown in FIG. 3, a substrate 100, for example, a P-type doped silicon substrate, is first provided. The substrate 100 includes a first active area AA-1 and a second active area AA-2 in proximity to the first active area AA-1. A trench isolation region STI-1 is formed between the first active area AA-1 and the second active area AA-2. The upper part of the trench isolation region STI-1 may slightly protrude from a main surface 100a of the substrate 100. According to an embodiment of the present invention, the first active area AA-1 and the second active area AA-2 extend along the first direction (for example, the reference X axis in FIG. 1).

Subsequently, a floating gate polysilicon layer FGP is formed on the first active area AA-1. A top surface TS1 of the floating gate polysilicon layer FGP is approximately flush with a top surface TS2 of the trench isolation region STI-1. According to an embodiment of the present invention, before forming the floating gate polysilicon layer FGP, the floating gate dielectric layer FD may be formed. According to an embodiment of the present invention, the floating gate dielectric layer FD may include silicon dioxide, but is not limited thereto.

Figure 4:
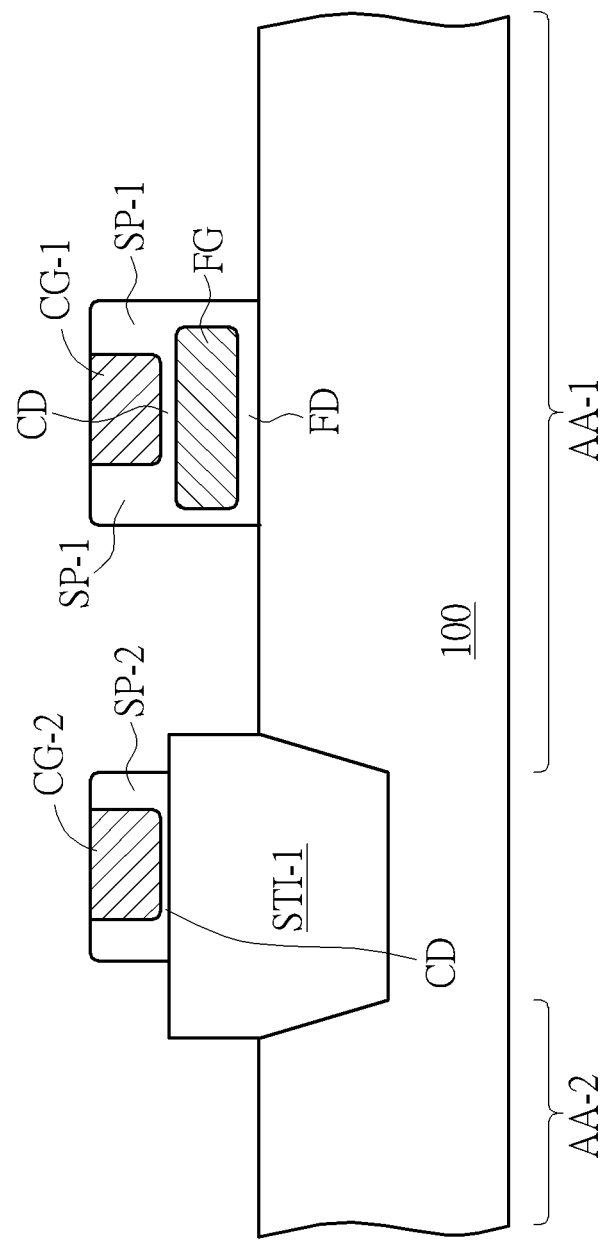

As shown in FIG. 4, a first control gate CG-1 is formed on the floating gate polysilicon layer FGP, a second control gate CG-2 is formed on the trench isolation region STI-1, and then an etching process is performed to etch the floating gate polysilicon layer FGP so as to define the floating gate FG According to an embodiment of the present invention, before forming the first control gate CG-1 and the second control gate CG-2, a dielectric layer CD, for example, ONO dielectric layer, may be formed on the floating gate FG and the trench isolation region STI-1. Subsequently, a first spacer SP-1 may be formed on the sidewall of the first control gate CG-1, and a second spacer SP-2 may be formed on the sidewall of the second control gate CG-2.

Figure 5:
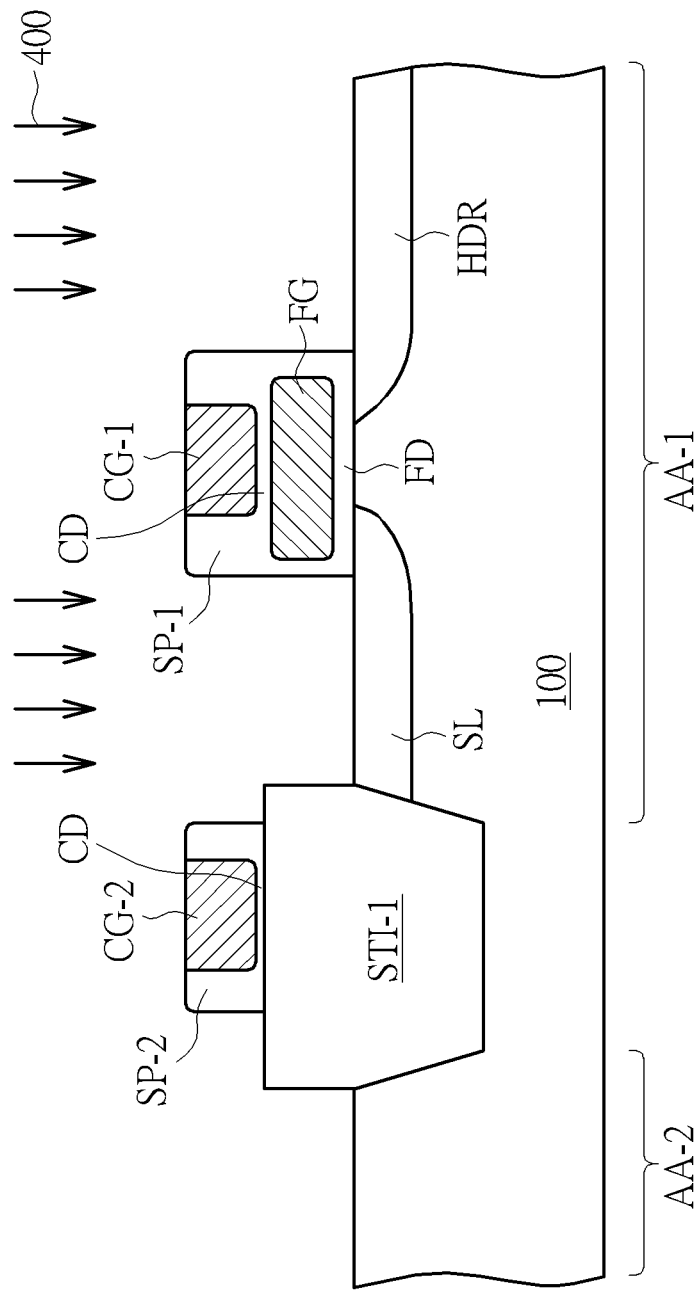

As shown in FIG. 5, a first ion implantation process 400 is then performed to form a source line region SL adjacent to the trench isolation region STI-1 in the first active area AA-1, and a heavily doped region HDR spaced apart from the source line region SL in the first active area AA-1. According to an embodiment of the present invention, for example, the heavily doped region HDR and the source line region SL may be $N^+$ doped regions.

Figure 6:
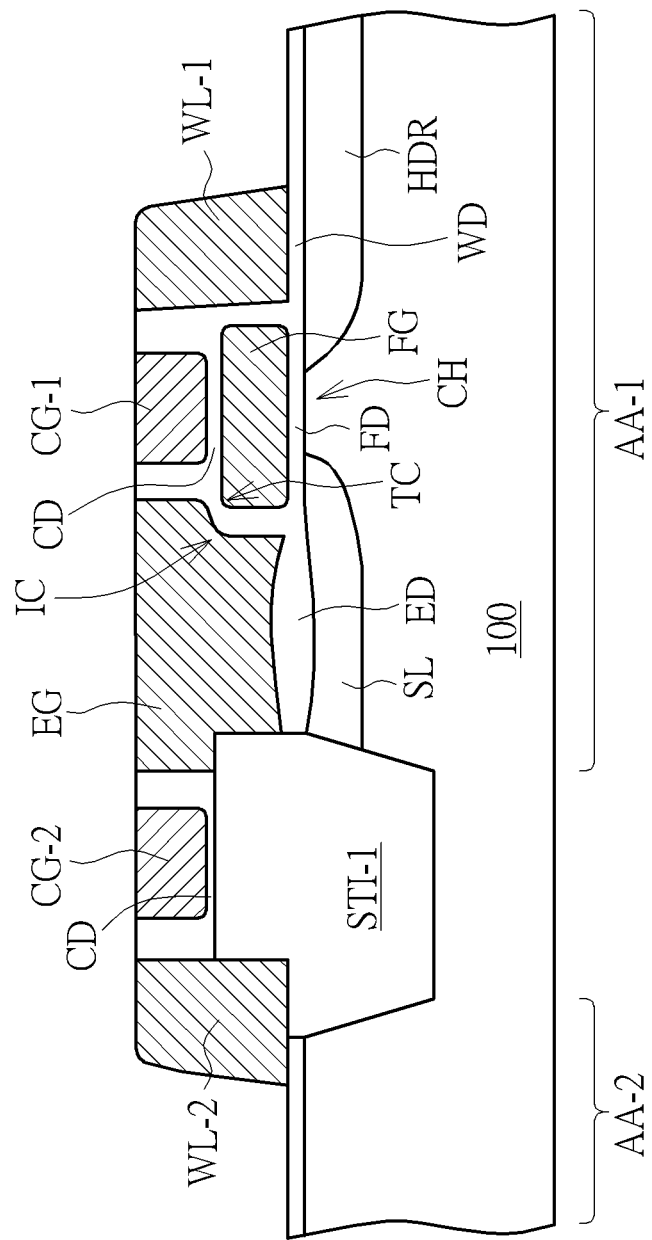

As shown in FIG. 6, an erase gate EG is then formed on the source line region SL. A first word line WL-1 is formed adjacent to the floating gate FG and the first control gate CG-1. A second word line WL-2 is formed adjacent to the second control gate CG-2. The method of forming the erase gate EG, the first word line WL-1 and the second word line WL-2 may include, but is not limited to, polysilicon deposition and etching back. A gate dielectric layer WD is provided between the first word line WL-1 and the heavily doped region HDR. The second control gate CG-2 is formed on part of the trench isolation region STI-1. According to an embodiment of the present invention, a channel region CH is disposed between the heavily doped region HDR and the source line region SL. The channel region CH is located directly under the floating gate FG.

According to an embodiment of the present invention, the erase gate EG is a T-shaped erase gate, characterized in that a top corner TC of the floating gate FG points toward an inside corner IC of the T-shaped erase gate EG. According to an embodiment of the present invention, the source line region SL, the erase gate EG, the first word line CG-1 and the second word line CG-2 extend along the second direction (for example, the reference Y axis in FIG. 1). According to an embodiment of the present invention, for example, before the erase gate EG is formed, an erase gate dielectric layer ED may be formed first. According to an embodiment of the present invention, for example, the thickness of the erase gate dielectric layer ED may be greater than that of the floating gate dielectric layer FD, but is not limited thereto.

Figure 7:
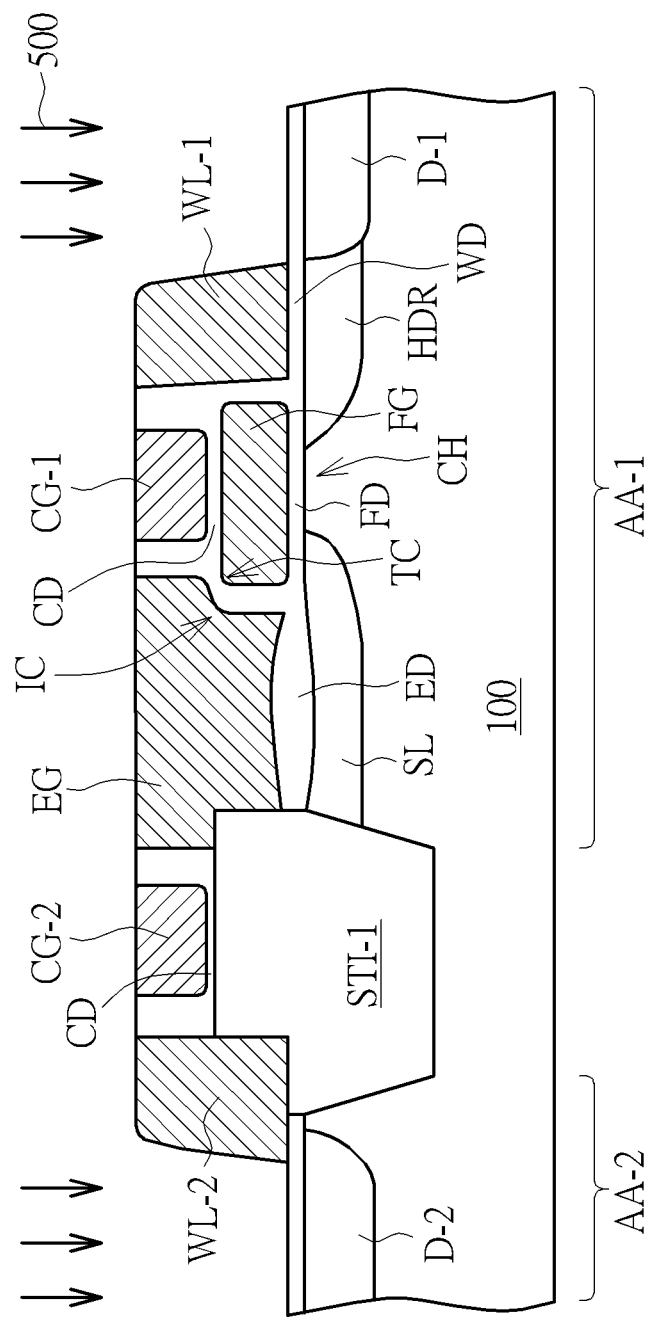

As shown in FIG. 7, a second ion implantation process 500 is then performed to form a first drain doped region D-1 adjacent to the first word line WL-1 in the first active area AA-1, and a second drain doped region D-2 adjacent to the second word line WL-2 in the second active area AA-2. According to an embodiment of the present invention, the heavily doped region HDR overlaps with the first drain doped region D-1. According to an embodiment of the present invention, the first drain doped region D-1 and the second drain doped region D-2 are $N^+$ doped regions.

Figure 8:
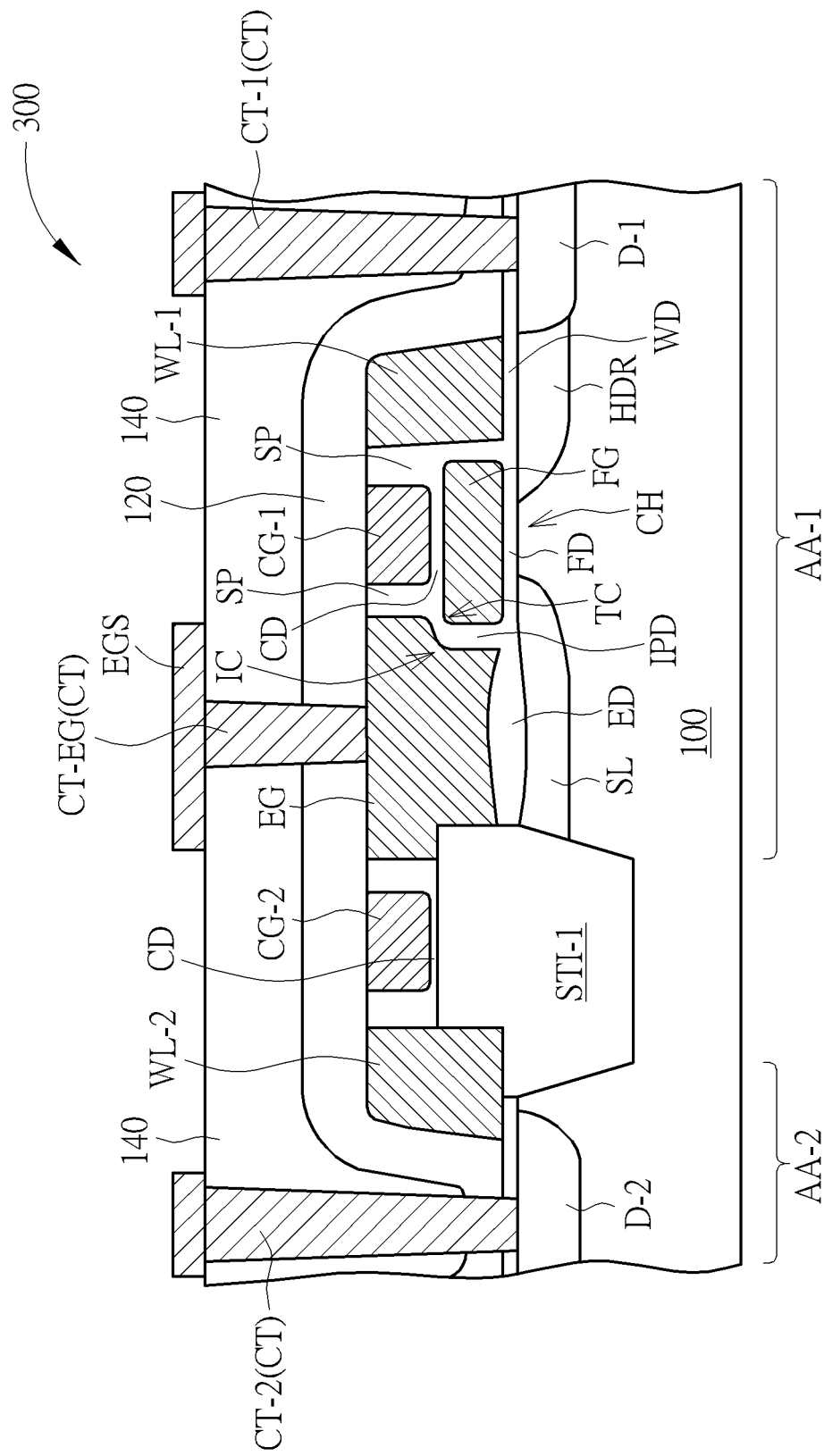

As shown in FIG. 8, a chemical vapor deposition (CVD) process is then performed to conformally deposit a contact etch stop layer 120 on the substrate 100. An interlayer dielectric layer 140 is then deposited on the contact etch stop layer 120. Subsequently, metal contacts CT are formed in the interlayer dielectric layer 140 and the contact etch stop layer 120. For example, the metal contacts CT may include a first drain contact CT-1 electrically connected to the first drain doped region D-1, a second drain contact CT-2 electrically connected to the second drain doped region D-2, and an erase gate contact CT-EG electrically connected to the erase gate EG. For example, the metal contact CT may be tungsten metal plugs, but not limited thereto. According to an embodiment of the present invention, the erase gate contact CT-EG can be electrically connected to the erase gate connection strap EGS, and then electrically connected to an erase gate voltage through the upper-layer metal interconnection (not shown).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate comprising a first active area and a second active area in proximity to the first active area;
   a trench isolation region between the first active area and the second active area;
   a source line region disposed in the first active area and adjacent to the trench isolation region;
   an erase gate disposed on the source line region;
   a floating gate disposed on a first side of the erase gate;
   a first control gate disposed on the floating gate;
   a first word line disposed adjacent to the floating gate and the first control gate and insulated therefrom;
   a heavily doped region disposed in the first active area and directly under the first word line, wherein the first word line completely overlaps with the heavily doped region;
   a second control gate disposed on a second side of the erase gate and on the trench isolation region; and
   a second word line disposed adjacent to the second control gate and insulated therefrom.

2. The semiconductor memory device according to claim 1 further comprising:
   a first drain doped region disposed in the first active area and adjacent to the first word line.

3. The semiconductor memory device according to claim 2 further comprising:
   a second drain doped region disposed in the second active area and adjacent to the second word line.

4. The semiconductor memory device according to claim 1, wherein the heavily doped region is contiguous with the first drain doped region and is spaced apart from the source line region.

5. The semiconductor memory device according to claim 1, wherein the heavily doped region, the first drain doped region and the source line region are $N^+$ doped regions.

6. The semiconductor memory device according to claim 1 further comprising:
   an erase gate contact disposed directly on the erase gate.

7. The semiconductor memory device according to claim 1, wherein the first active area and the second active area elongate along a first direction, and the source line region, the erase gate, the first word line, and the second word line elongate along a second direction.

8. The semiconductor memory device according to claim 7, wherein the first direction is orthogonal to the second direction.

9. The semiconductor memory device according to claim 1, wherein the erase gate is a T-shaped erase gate, and wherein a top corner of the floating gate points toward an inside corner of the T-shaped erase gate.

10. A semiconductor memory device, comprising:
    a substrate comprising a first active area and a second active area in proximity to the first active area;
    a trench isolation region between the first active area and the second active area;
    a source line region disposed in the first active area and adjacent to the trench isolation region;
    an erase gate disposed on the source line region;
    a floating gate disposed on a first side of the erase gate;
    a first control gate disposed on the floating gate;
    a first word line disposed adjacent to the floating gate and the first control gate and insulated therefrom;
    a second control gate disposed on a second side of the erase gate and on the trench isolation region;
    a second word line disposed adjacent to the second control gate and insulated therefrom;
    a first drain doped region disposed in the first active area and adjacent to the first word line; and
    a second drain doped region disposed in the second active area and adjacent to the second word line, wherein the trench isolation region separates the source line region from the second drain doped region.

11. The semiconductor memory device according to claim 10 further comprising:
    a heavily doped region disposed in the first active area and directly under the first word line.

12. The semiconductor memory device according to claim 11, wherein the first word line completely overlaps with the heavily doped region.

13. The semiconductor memory device according to claim 11, wherein the heavily doped region is contiguous with the first drain doped region and is spaced apart from the source line region.

14. The semiconductor memory device according to claim 11, wherein the heavily doped region, the first drain doped region and the source line region are $N^+$ doped regions.

15. The semiconductor memory device according to claim 10 further comprising:
    an erase gate contact disposed directly on the erase gate.

16. The semiconductor memory device according to claim 10, wherein the first active area and the second active area elongate along a first direction, and the source line region, the erase gate, the first word line, and the second word line elongate along a second direction.

17. The semiconductor memory device according to claim 16, wherein the first direction is orthogonal to the second direction.

18. The semiconductor memory device according to claim 10, wherein the erase gate is a T-shaped erase gate, and wherein a top corner of the floating gate points toward an inside corner of the T-shaped erase gate.

19. The semiconductor memory device according to claim 10, wherein no floating gate is disposed between the second control gate and the trench isolation region.

* * * * *